May 12, 1970 L. H. KOSOWSKY ET AL 3,512,012

FIELD EFFECT TRANSISTOR CIRCUIT

Filed Nov. 16, 1965

INVENTORS
Lester H. Kosowsky
Kenneth Solomon
BY
Shenier & O'Connor
ATTORNEYS

United States Patent Office 3,512,012

Patented May 12, 1970

3,512,012

FIELD EFFECT TRANSISTOR CIRCUIT

Lester H. Kosowsky, Norwalk, and Kenneth Solomon, Trumbull, Conn., assignors to United Aircraft Corporation, East Hartford, Conn., a corporation of Delaware Filed Nov. 16, 1965, Ser. No. 508,070
Int. Cl. H03k *1/16*; H03c *3/00*
U.S. Cl. 307—233 6 Claims

ABSTRACT OF THE DISCLOSURE

Insulated-gate field effect transistor circuits using the differing control properties of the insulated-gate and of the substrate include low-pass filters and modulators. In low-pass filter circuits, the insulated-gate is used to control over a wide range the approximate dynamic drain impedance, while the substrate is used to control over a narrow range the precise drain impedance and hence the cut-off frequency of the filter. In modulator circuits, small amplitude signals are applied to the insulated-gate, while large amplitude inputs are applied through a capacitor to the substrate which acts as a rectifier.

BACKGROUND OF THE INVENTION

An insulated-gate field effect transistor comprises a substrate having a relatively light doping to provide a low density of carriers of, for example, p-type conductivity. Into the substrate are diffused two adjacent highly doped regions of opposite conductivity, such as n-type, which are termed the source and the drain. The surface region between the source and drain is provided with an insulating layer of oxide upon which is mounted a conductive plate which is termed the gate. Because of the small doping concentration in the p-type substrate, surface inversion of conductivity type readily occurs. The surface of the substrate immediately under the gate assumes a slight n-type conductivity which is termed an n-type channel. The depth of this channel may be increased by applying a positive voltage to the gate electrode which electrostatically induces further negative charges in the channel. The depth of the channel may be reduced by applying a negative potential to the gate electrode which electrostatically repels electrons.

We have discovered that the depth of the channel of insulated-gate field effect transistors, whether of the n-channel type described above or of the p-channel type, may be varied by controlling the potential of the substrate. This permits the use of an insulated-gate field effect transistor as a four-terminal device which is advantageously employed in such circuits as modulators and frequency converters.

We have further discovered that the dynamic drain impedance of an insulated-gate field effect transistor may be varied as functions of both the gate and substrate potentials and may range up to values exceeding 200 megohms. This permits the use of insulated-gate field effect transistors in high-pass molecular filter circuits employing capacitors of less than 100 picofarads while achieving cut-off frequencies of less than 10 cycles per second. The cut-off frequencies of such high-pass filters may be readily controlled by varying either or both of the gate and substrate potentials. We have further discovered that the sensitivity of the dynamic drain impedance is much greater to changes in gate potential than to changes in substrate potential, so that changes in substrate potential afford a "fine" change in dynamic drain impedance while changes in gate potential afford a "coarse" change in dynamic drain impedance.

One object of our invention is to provide a circuit employing an insulated-gate field effect transistor as a four-terminal device in which control potentials are applied to the substrate.

Another object of our invention is to provide a high-pass filter circuit of very low cut-off frequency employing very small capacitance values in conjunction with the extremely high dynamic drain impedance of an insulated-gate field effect transistor.

Other and further objects of our invention will appear from the following description:

In general, our invention contemplates the provision of an insulated-gate field effect transistor having a connection to its substrate. In one embodiment of our invention an input signal is coupled through a capacitor of small value to the drain of the transistor to provide a high-pass filter circuit having a low cut-off frequency. Large changes in cut-off frequency are obtained by applying potentials to the gate; while small changes in cut-off frequency are obtained by applying potentials to the substrate.

In another embodiment of our invention a large amplitude alternating-current signal of a certain frequency is applied to the substrate; and another signal is applied to the gate. A resonant circuit is coupled to the drain. If the frequency of the resonant circuit and the frequency of the signal applied to the substrate are the same, then the device functions as a "radio-frequency" modulator providing an output in accordance with the "audio-frequency" signal applied to the gate. On the other hand, if an alternating-current signal is applied to the gate of a carrier frequency different from that applied to the substrate and the resonant circuit is tuned to either the sum or difference frequency, then the device functions as a frequency converter.

In the accompanying drawings which form part of the instant specification and which are to be read in conjunction therewith and in which like reference numerals are used to indicate like parts in the various views.

Figure 1:
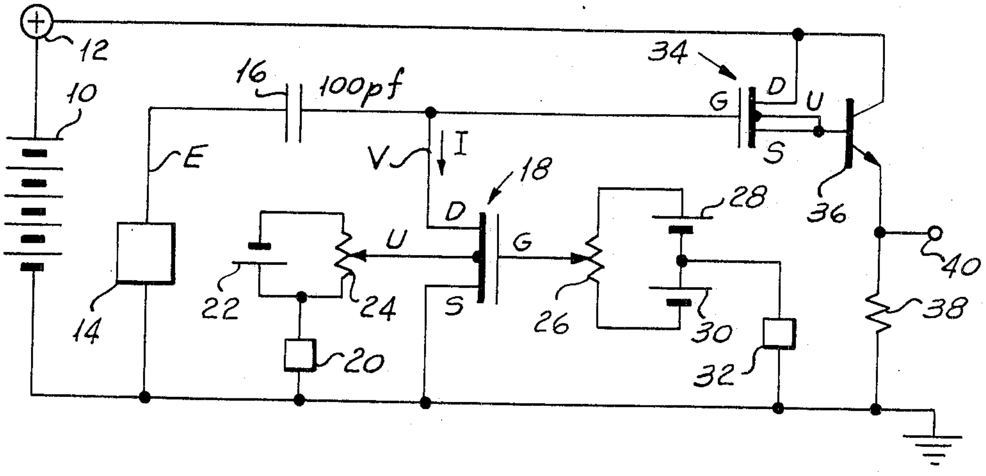
FIG. 1 is a schematic view showing a four-terminal insulated-gate field effect transistor employed in a high-pass filter circuit of low cut-off frequency.

More particularly, referring now to FIG. 1 of the drawings, we provide an insulated-gate field effect transistor, indicated generally by the reference numeral 18, having a drain D, a source S, a gate G, and a substrate U. One terminal of an alternating current source 14 of input voltage E is coupled through a small capacitor 16 having, for example, a value of 100 pf. to the drain of transistor 18. The other terminal of the input source 14 and the source S of transistor 18 are grounded. Transistor 18 may conveniently be of the n-channel type. The substrate of transistor 18 is connected to the slider of a potentiometer 24 which is shunted by a bias battery 22. The positive terminal of battery 22 is connected through an auxiliary voltage source 20 to ground. The negative terminal of a bias battery 28 and the positive terminal of a bias battery 30 are connected through an auxiliary voltage source 32 to ground. Batteries 28 and 30 are shunted by a potentiometer 26, the slider of which is connected to the gate of transistor 18. The negative terminal of a power supply battery 10 is grounded and the positive terminal 12 thereof is connected to the drain of an auxiliary n-channel insulated-gate field effect transistor 34 and to the collector of an N-P-N transistor 36. The substrate of transistor 34 is short-circuited to its source S to reduce noise. The drain of transistor 18 is connected to the gate of transistor 34. The source S of transistor 34 is connected to the base of transistor 36. The emitter of transistor 36 is connected to an output terminal 40 and through a resistor 38 to ground.

In operation of the circuit of FIG. 1 input voltages E from source 14 are applied to the high-pass filter comprising capacitor 16 and the dynamic drain impedance of transistor 18. The filter output voltage V which exists at the drain of transistor 18 is coupled to a first buffer amplifier comprising transistor 34 the gate of which introduces no loading of the filter output. The input impedance of transistor 34 may exceed 1000 megohms. Transistor 34 acts as a source follower and drives transistor 36 which acts as an emitter follower. The voltage at terminal 40 is a substantial duplication of the voltage V existing at the drain of transistor 18. Assume for the moment that auxiliary sources 20 and 32 provide no signal. Potentiometer 26 is adjusted to provide either positive or negative voltages to the gate of transistor 18. Potentiometer 24 is adjusted to provide only negative voltages to the substrate of transistor 18. It will be appreciated that the substrate of transistor 18 cannot be driven positive since it has p-type conductivity. Potentiometer 26 and voltage source 32, acting either alone or in combination, provide a coarse control of the dynamic drain impedance of transistor 18, while potentiometer 24 and voltage source 20, acting alone or in combination, provide a fine control of the dynamic drain impedance of transistor 18. With the slider of potentiometer 26 in the center position shown, the gate of transistor 18 is at ground potential.

Figure 2:
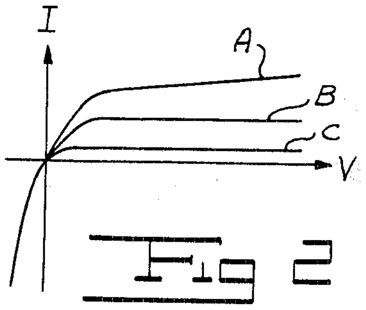
FIG. 2 is a graph of drain current against drain voltage for various gate and substrate potentials of an insulated-gate field effect transistor.

Referring now to FIG. 2, curve A shows the drain characteristic of transistor 18 with the gate at ground potential and the substrate at ground potential, as where the slider of potentiometer 24 is moved to its downward limit. Curve B shows the drain characteristic with the gate at ground potential and the substrate at an intermediate negative potential, as where the slider of potentiometer 24 is in the center positon shown. Curve C is the drain characteristic with the gate at ground and a large negative substrate potential, as where the slider of potentiometer 24 is moved to its upward limit. With potentiometer 24 in the position shown, curves A or C may be also obtained by adjusting potentiometer 26 so that the gate of transistor 18 is either positive or negative.

We have found that the dynamic drain impedance of the transistor is approximately twice as sensitive to changes in gate potential as it is to changes in substrate potential. It will be noted that for each of curves A, B and C the drain current I rises rapidly to certain values for small drain voltages V, and then tends to remain constant. The slopes of the substantially horizontal portions of curves A, B and C determine the dynamic drain impedances. The dynamic impedance for curve A may be 2 megohms; the dynamic impedance of curve B may be 20 megohms; and the dynamic impedance of curve C may be 200 megohms. In the constant current regions, equal increments of change in drain current product equal factors of change in dynamic drain impedance. Curves A, B and C may exhibit constant current characteristics at respective currents of 5, 3 and 1 milliamperes. The upward slope of curve A in the constant current region has been shown exaggerated. Thus successive 2 milliampere changes in drain current produce successive tenfold changes in dynamic drain impedance. The transductance of the transistor is substantially constant except for drain currents less than 1 milliampere where the transductance decreases to zero. Accordingly, equal increments of change in potential of either gate or substrate also produce equal factors of change in drain impedance. It will be noted that the drain characteristic in the third quadrant for negative drain voltages and currents exhibits an extremely low impedance characteristic. This low output impedance characteristic occurs by virtue of inverted transistor action since the drain functions as a "source" and the source functions as a "drain" so that the drain impedance is actually the extremely low output impedance of a "source" follower.

Figure 3:
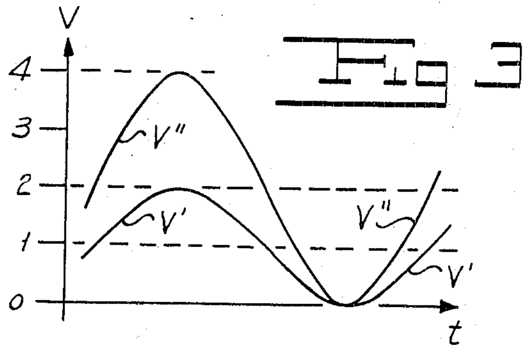
FIG. 3 is a graph of drain voltage against time for various amplitudes of an input voltage of constant frequency for the circuit of FIG. 1.

Referring now to FIG. 3, the curve V′ shows the drain voltage for an applied input E of one volt peak value; and the curve V″ shows the drain voltage for an applied input E of two volts peak value. It will be noted that the rectification efficiency of transistor 18 is substantially unity. There is only a slight negative excursion of the drain during which a large current pulse flows through capacitor 16 for a short interval. The charge transferred to capacitor 16 by this pulse is equal to the charge which is transferred from the capacitor during the remaining portion of an input cycle by virtue of the small constant current flow. It will be noted that transistor 18 is self-biased; and the drain voltage V contains a direct-current component which is substantially equal to the peak value of the alternating current input E. This direct-current voltage appears across capacitor 16.

Figures 4, 5:
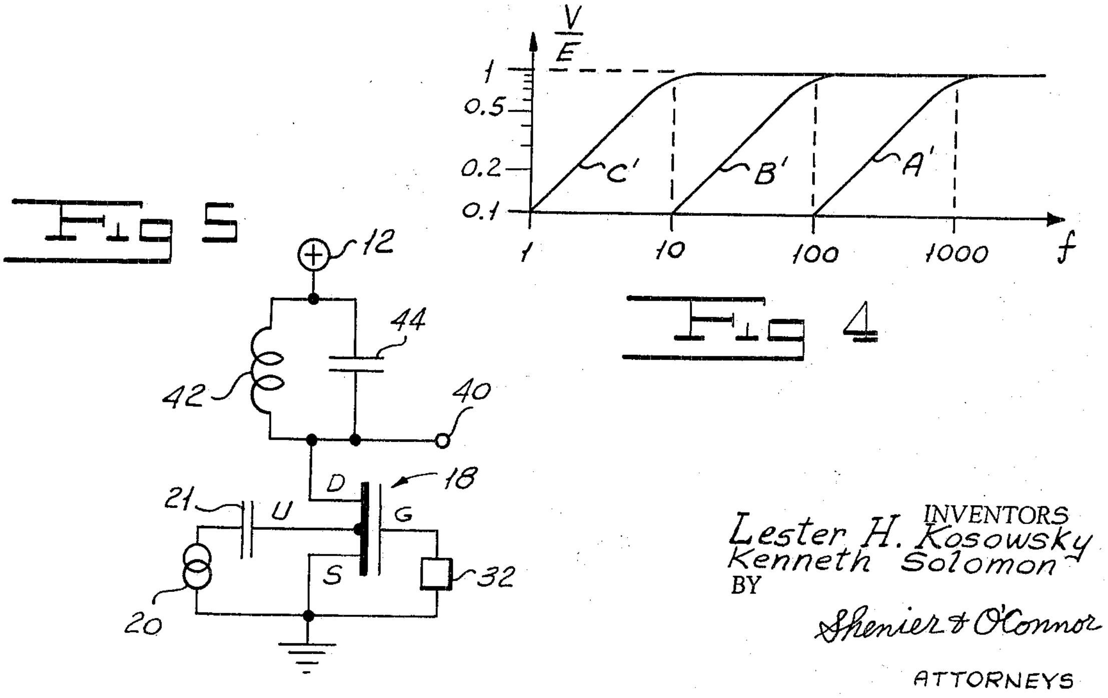
FIG. 4 is a graph of the ratio of output voltage to input voltage against frequency for various gate and substrate potentials in the circuit of FIG. 1.
FIG. 5 is a schematic view showing a four-terminal insulated-gate field effect transistor employed in a circuit which may serve as a modulator or frequency converter.

Referring now to FIG. 4, curves A′, B′ and C′ show the frequency characteristics of the high-pass filter corresponding to the respective dynamic drain impedance curves A, B and C of FIG. 2. The cut-off frequencies of curves A′, B′ and C′ are respectively 1000, 100 and 10 cycles per second. Potentials applied from either or both of voltage sources 20 and 32 may thus shift the cut-off frequency of the filter from the value determined by the settings of potentiometers 24 and 26.

Referring now to FIG. 5, the positive potential at terminal 12 is coupled through a parallel resonant circuit comprising inductor 42 and capacitor 44 to the drain of transistor 18, which is directly connected to output terminal 40, since no intermediate buffering need be provided. Voltage source 32 may be directly connected to the gate of transistor 18. Source 20 may comprise an oscillator of predetermined frequency which in this case is coupled through a capacitor 21 to the substrate.

In operation of the circuit of FIG. 5 as a modulator, the parallel resonant circuit is tuned to the frequency of oscillator 20. The signal at the substrate of transistor 18 is self-rectified. The substrate cannot be driven appreciably above ground potential since a large current pulse will flow through the substrate-source junction of transistor 18. Capacitor 21 thus builds up to a negative voltage which is substantially equal to the peak value of the voltage supplied by oscillator 20. Transistor 18 is alternately rendered conductive and non-conductive by the signal applied to the substrate. The drain current drawn by the transistor during its conductive intervals is determined by the gate voltage supplied from modulating source 32.

In operation of the circuit of FIG. 5 as a frequency converter, source 32 provides a modulated carrier signal of a carrier frequency different from that of the local oscillator 20; and the intermediate-frequency resonant circuit is tuned to either of the sum and difference frequencies.

It will be seen that we have accomplished the objects of our invention. We have provided circuits employing insulated-gate field effect transistors as four-terminal devices in which control potentials are applied to both the gate and the substrate. In modulator and frequency converter applications, advantage is taken of the rectifying characteristic of the substrate-source junction. In high-pass filter applications, advantage is taken of the unilateral drain characteristic which self-biases the transistor into the high dynamic drain impedance region thus affording very low cut-off frequencies with very small capaictance values.

It will be understood that certain features and subcombinations are of utility and may be employed without reference to other features and subcombinations. This is contemplated by and is within the scope of our claims. It is further obvious that various changes may be made in details within the scope of our claims without departing from the spirit of our invention. It is therefore to be understood that our invention is not to be limited to the specific details shown and described.

Having thus described our invention, what we claim is:

1. A modulator circuit including in combination an insulated-gate field effect transistor having a source and a drain and an insulated gate and a substrate, a large amplitude alternating-current source, a small amplitude signal source, a tuned output circuit, means coupling the output circuit to the drain, means coupling the small amplitude signal source between the transistor source and the insulated gate, and means including a capacitor for coupling the large amplitude source between the transistor source and the substrate.

2. A high-pass filter circuit including in combination a source of an input signal, a first and a second insulated-gate field effect transistor each having a source and a drain and an insulated-gate and a substrate, means including a capacitor for coupling the input signal source between the drain and the source of the first transistor, means connecting the drain of the first transistor to the insulated-gate of the second transistor, first means including a first biasing source connected between the insulated-gate and the source of the first transistor for controlling over a wide range the approximate dynamic impedance of the drain; and second means including a second biasing source connected between the substrate and the source of the first transistor for controlling over a narrow range the precise dynamic impedance of the drain, thereby to govern the cut-off frequency of the filter circuit.

3. A transistor circuit including in combination an insulated-gate field effect transistor having a source and a drain and an insulated-gate and a substrate, a first variable signal source, a second variable signal source independent of the first signal source, the first signal source being independent of the second signal source and comprising means for providing signals of both positive and negative polarities, means coupling the first signal source between the insulated-gate and the transistor source, means coupling the second signal source between the substrate and the transistor source, the second signal source comprising means for providing variable signals of but one polarity, and means coupled to the drain for providing an alternating current output signal.

4. A transistor circuit as in claim 3 which further includes an alternating current input signal source and means comprising a capacitor for coupling the input signal source to the drain, wherein the output signal means comprises a further insulated-gate field effect transistor.

5. A transistor circuit as in claim 3 wherein the output signal means comprises a resonant circuit and wherein the second signal source comprises an oscillator connected in series with a capacitor.

6. A transistor circuit as in claim 3 which further includes an alternating current input signal source and means comprising an impedance for coupling the input signal source to the drain.

References Cited

UNITED STATES PATENTS

| | | | |
|---|---|---|---|
| 2,570,938 | 10/1951 | Goodrich | 332—16 |
| 3,391,354 | 7/1968 | Ohashi | 332—31 |
| 3,311,756 | 3/1967 | Nagata et al. | 307—304 |
| 3,296,547 | 1/1967 | Sickles | 307—251 |

DONALD D. FORRER, Primary Examiner

D. M. CARTER, Assistant Examiner

U.S. Cl. X.R.

307—295, 304; 332—16